United States Patent [19]
Ludwig et al.

[11] Patent Number: 4,967,104
[45] Date of Patent: Oct. 30, 1990

[54] CIRCUIT FOR INCREASING THE OUTPUT IMPEDANCE OF AN AMPLIFIER

[75] Inventors: Thomas Ludwig, Sindelfingen; Helmut Schettler, Dettenhausen; Otto M. Wagner, Altdorf; Rainer Zuhlke, Leonberg, all of Fed. Rep. of Germany

[73] Assignee: International Business Machines Corporation, Armonk, N.Y.

[21] Appl. No.: 416,194

[22] Filed: Oct. 2, 1989

[30] Foreign Application Priority Data

Oct. 11, 1988 [EP] European Pat. Off. ........ 88116818.1

[51] Int. Cl.$^5$ ............................................. H03K 17/16
[52] U.S. Cl. .................................... 307/443; 307/572; 307/585
[58] Field of Search ............... 307/443, 572, 576, 577, 307/579, 585

[56] References Cited

U.S. PATENT DOCUMENTS

| | | | |
|---|---|---|---|
| 4,340,867 | 7/1982 | Sano | 307/443 X |
| 4,504,779 | 3/1985 | Haman | 323/349 |
| 4,622,482 | 11/1986 | Ganger | 307/585 |
| 4,739,193 | 4/1988 | Doty | 307/443 |
| 4,758,743 | 7/1988 | Dehganpour et al. | 307/443 |

OTHER PUBLICATIONS

IBM Technical Disclosure Bulletin, vol. 30, No. 9, pp. 174–176, "Low L di/dt Noise Off–Chip Driver".
IBM Technical Disclosure Bulletin, vol. 27, No. 1A, pp. 13–14, "Circuit To Control the Time Rate of Change of Current at the Output Node of an Off–Chip Driver".

*Primary Examiner*—James B. Mullins
*Attorney, Agent, or Firm*—Francis J. Thornton

[57] ABSTRACT

The present invention teaches an arrangement for increasing the output impedance of a power amplifier coupled to a capacitively loaded line during the switching of power levels by the amplifier on the line. The arrangement of the invention reduces undesired noise voltage during switching. The present invention achieves this end by using a control circuit composed of a differential amplifier which has one input fed from the junction of an impedance resistor and a transistor that simulate the power stage transistor in the power amplifier being switched. This control circuit provides control voltage outputs to power control transistors which are connected to and control the speed of the power stage transistors used to change and discharge the capacitively loaded line.

6 Claims, 1 Drawing Sheet

CIRCUIT FOR INCREASING THE OUTPUT IMPEDANCE OF AN AMPLIFIER

FIELD OF THE INVENTION

The invention relates generally to amplifiers and more particularly to a circuit for increasing the output impedance of an amplifier to a predetermined value when switching the amplifier between two voltage levels.

DESCRIPTION OF THE PRIOR ART

For parallel data transmission in computers, several power amplifiers have to be switched on or off simultaneously. The change of current occurring in the supply lines during the switching process causes, owing to the inductance L of the lines, a noise voltage $u_L$ whose value, according to the law of induction, is $u_L = -L(di/dt)$. The greater the number of power amplifiers switching simultaneously, and the higher their speed, i.e. the lower their output impedance, the higher the undesired noise voltage on the supply lines. Thus, circuits on one and the same semiconductor chip, as well as other semiconductor chips connected to the amplifiers, can be affected in their correct operation. The induced noise voltage so transmitted can be interpreted by receiver circuits as a data change thus causing faulty functions in the computer.

It is therefore desirable that any such noise voltage remains below the level where it can cause adverse effects in other circuits. In the past, to avoid the noise problem, power amplifiers were not simultaneously switched, but were switched successively. However, such successive switching reduces the speed of data transmission and is generally undesirable.

European Patent Application No. 86114537 (publication no. 264470) sets out a circuit for reducing the above-mentioned noise voltage encountered when simultaneous switching several power amplifiers. According to the teaching of this patent application, the noise voltage is reduced by influencing the edge slope of the power amplifier output signals via a digital control circuit. Specifically, the actual value of the edge slope is recorded via the number of clock pulses applied to a counter during a measuring interval depending on the edge slope. Such a measuring interval is generated by applying the pulses of a ring oscillator to another counter until the overflow of the latter. Actual and nominal values of the edge slope are compared, and the result used to alter the contents of a left/right shift register whose outputs influence, via control lines, the control inputs of the power amplifiers in order to change their edge slope by connecting or disconnecting selected output transistors.

The above solution for digital control of the output signal edge slope requires considerable additional circuitry for the ring oscillator, the counters, the comparator circuit and the shift register and it can not be used in synchronously operating data processing systems or within asynchronously operating parts of a system which as a whole operates synchronously.

SUMMARY OF THE INVENTION

The present invention remedies all the above described drawbacks. The present invention achieves the object of providing for increasing the output impedance of a circuit to a predetermined value when switching a power amplifier between two voltage levels. The undesired noise voltage during switching decreases with the increase of the output impedance of the power amplifier.

The present invention achieves this while reducing the amount of circuitry required. Moreover, the present invention can also be used in an asynchronously operating data processing system, or in asynchronously operating parts of a system which as a whole works synchronously.

The invention will be explained in detail with reference to the drawings.

DESCRIPTION OF THE PREFERRED EMBODIMENT

Figure 1:
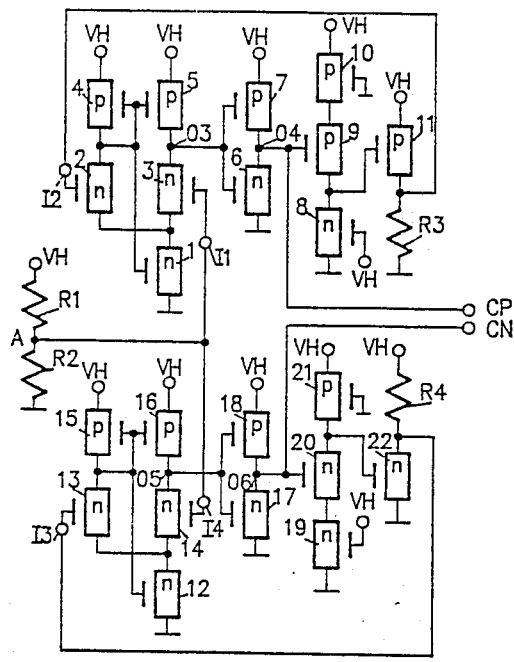
FIG. 1 is a schematic of a control circuit used in the present invention.
Figure 2:
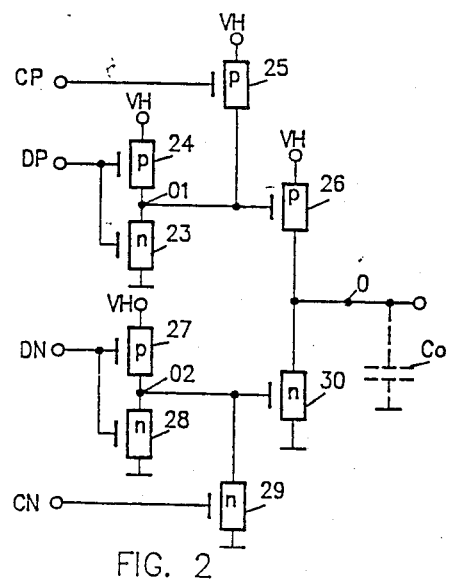
FIG. 2 is a schematic of a first power amplifier using the present invention.

FIG. 1 illustrates a control circuit as used in the present invention, by means of which the output impedance of a power amplifier, such as shown in FIG. 2 is changed, during switching from a first to a second voltage level to a predetermined value. The control circuit consists of an upper and a lower section which, with the exception of the conductivity of the field effect transistors 9 and 20 as well as 11 and 22 and the arrangement of resistors R3 and R4, are of a similar structure. Specifically, the control circuit has two differential amplifiers. The first comprising transistors 1, 2, 3, 4, and 5 and having inputs I1 and I2 and an output O3. The second differential amplifier circuit comprises of transistors 12, 13, 14, 15, and 16, and inputs I3 and I4 and an output O5. In the first differential amplifier transistors 4 and 5 serve as load transistors and in the second differential amplifier transistors 15 and 16 also function as load transistors. The gates of transistors 1, 4 and 5 are all coupled together and to the junction between transistors 2 and 4 so that transistors 1, 4 and 5 form a constant current source for the first differential amplifier. Similarly, the gates of transistors 12, 15, and 16 are all joined together and to the junction between transistors 13 and 15 to also form a constant current source for the second differential amplifier. The junction O3 between transistors 3 and 5 is connected to the gates of an inverter comprised of complementary transistors 6 and 7 whose junction 04 is coupled to a power simulating circuit, comprised of serial transistors 8, 9, and 10, simulation transistor 11 and resistor R3, and to a control voltage output CP. More specifically the output 04, the gate of a control transistor 9 which is the control transistor of the serial transistors 8, 9, and 10. Similarly, the junction 05 between transistors 14 and 16, is connected to the gates of an inverter comprised of complementary transistors 17 and 18 and the connection 06, between the gates of transistors 17 and 18, is coupled directly to the gate of control transistor 20 and a control voltage output CN. It should be noted that the sources of the transistors 1, 6, 12, and 17 are all connected to a reference potential, such as ground, and the source electrodes of transistors 4, 5, 7, 15, 16, and 18 are all connected to a positive operating voltage source VH. The gates of transistors 3 and 14, I1 and I4 respectively, are coupled to the tap A of a voltage divider formed of two resistors R1 and R2.

Desirably, these resistors are of equal value and because the voltage divider is coupled in series between the reference voltage and the operating voltage the VH voltage at the central tap A is the midpoint of these two voltages.

Figure 3:
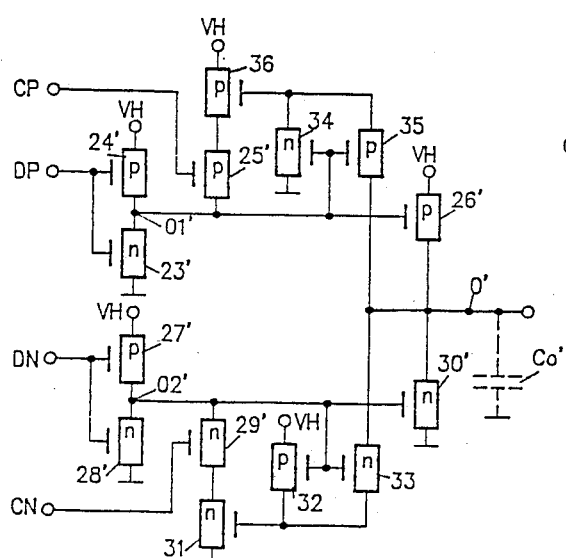
FIG. 3 is a schematic of a different embodiment of a power amplifier using the present invention.

By designing these differential amplifiers in the same semiconductor chip, a balance can be obtained so that the current sources 1 and 12 supply equally one-half of the total current of the circuit. As noted above the output O4 of transistors 6 and 7 is coupled to a power simulating circuit comprising serial transistors 8, 9, 10, simulation transistor 11 and impedance resistor R3. Similarly, the output O6 of the inverting complementary pair of transistors 17 and 18 is coupled to the input of a second power simulating circuit consisting of serial transistors 19, 20, 21, feedback transistor 22 and impedance resistor R4. Transistor 11 of the first differential amplifier and transistor 22 of the second differential amplifier respectively simulate the power stage of a power amplifier circuit, such as is shown in FIG. 2 and Fig. 3. These power amplifier circuits receive the outputs CP and CN. The value of the resistors R3 and R4 represent the desired increased value of the output impedance of the power amplifier or an integral multiple thereof. The connecting points of the transistors 11 and 22 with their respective resistors R3 and R4 are fed back to the inputs I2 and I3 respectively which are connected to the gates of transistors 2 or 13 respectively.

It should be noted that the transistors 8, 9, and 10 are connected in series between the reference voltage and the operating voltage VH. The gate of transistor 10 is coupled to the reference voltage, the gate of transistor 8 is coupled to the operating voltage VH and the gate of transistor 11 is coupled to the connection between transistor 8 and transistor 9. Similarly, the transistors 19, 20, and 21 are coupled in series between the reference voltage and the operating voltage VH. Transistor 19 has its gate coupled to the operating voltage VH, the gate of transistor 21 is coupled to the reference voltage and the gate of transistor 22 is coupled to the connection between transistor 20 and 21. This circuit operates as follows.

When the operating voltage VH is applied to the circuit a voltage equal to the differential between the operating voltage and the reference voltage, preferably one-half the amplitude of the operating voltage VH, is applied to the gates of transistors 3 and 14, i.e. inputs I1 and I4, by tap A of the voltage divider. Simultaneously, the transistors 1 and 12, operating as constant current sources, supply equal currents which means that the gate potentials of transistors 2 and 13 is, at this point and time, the same as that of transistors 3 or 14, i.e. one-half the operating voltage VH. Since the gates of transistors 2 and 13 are connected to the connecting points of transistors 11 and R3 and 22 and R4 respectively, the potential at these connection points is also at VH/2 thus the impedance of transistors 11 and 22 equal the value of resistors R3 or R4 respectively, and the output voltage of the differential amplifiers appear on the respective outputs CP and CN which are fed to either FIG. 2 or FIG. 3, which represent one embodiment of the power amplifiers.

This control circuit ensures that the value predetermined by resistors R3 or R4 respectively is maintained. For example, if for any reason the potential at O4 rises the right hand branch of the differential amplifier pulls more current. The rise in potential at O4 also causes transistor 9 to be less conductive causing transistor 11 to become more conductive so that the potential at the juncture of transistor 11 and resistor R3 rises. This rise in potential is fed back to input I2 causing transistor 2 become more conductive until an equal current flows in the other branch and the circuit is stabilized.

Similarly, if the potential at O4 falls the potential at output O3 rises driving up the potential at the connection point of transistors 8 and 9 and at the gate of transistor 11. Transistor 11 becomes less conductive and the voltage at the connecting point of transistor 11 and resistor R3 decreases. This decrease is fed back to input I2 causing transistor 2 to be less conductive until an equal current again flows in the other branch of the amplifier and the circuit stabilizes.

Similar sequences occur in the other differential amplifier comprised of transistors 13, 14, 15, and 16.

The circuit of FIG. 2 comprises two sets of complementary inverter circuits, the first inverter circuit is coupled to the input DP and consists of complementary prestage transistors 23 and 24 coupled in series with one another and between the operating voltage VH and the reference voltage and having an output O1. The second inverter is comprised of complementary prestage transistors 27 and 28 which are also coupled in series between VH and the reference voltage and coupled to an input DN and has an output O2. The output O1 is coupled to the gate of a power stage transistor 26 and to the drain of a power control transistor 25. The gate of transistor 25 is coupled to the output CP of the circuit of FIG. 1 and its source is coupled to the operating voltage VH. The source of the power stage transistor 26 is similarly coupled to the operating source VH and its drain is coupled to the capacitively loaded output O. Similarly, the output O2 of the inverter circuit, comprised of prestage transistors 27 and 28, is coupled to the drain of power control transistor 29 and the gate of power stage transistor 30. The gate of transistor 29 is coupled to the output CN of the circuit in FIG. 1 and its source is coupled to the reference voltage. The source of the power stage transistor 30 is coupled to the reference voltage and its drain is coupled to the output line O. Because the gates of transistors 25 and 29 are respectively coupled to the output of the amplifier circuit of FIG. 1 respectively they are continuously operative and conductive.

To explain the operation of the power amplifier it is assumed initially that its output is low and that it is to be driven high. When the data input DP goes high, the transistor 23 is made conductive, causing the reference potential to be applied to the gate of the power stage transistor 26 rendering it conductive so that the capacitance $C_0$ of the output line rises towards the value of the operating voltage VH.

In order to reduce the current change versus time during the switching of the power transistor 26, and the noise voltage $u_L = L\,di/dt$ connected therewith, the output impedance of power stage transistor 26 is increased to a predetermined value by means of the control transistor 25, such that the magnitude of the current flowing through the transistor 25 depends on the control voltage applied to its gate by the signal CP received from output O4 of FIG. 1, thus reducing the gate potential of the power stage transistor 26 such that power stage transistor 26 shows the required increased output impedance.

If the output potential of the power amplifier is to change from its high to the low value, a negative potential is applied via its data input DN to the gate of the prestage transistor 27. In this manner, the transistor 27 is rendered conductive and applies a positive potential to the gate of a power stage transistor 30, which is then conductive and discharges the output line capacitance $C_0$, i.e. pulls output line O towards the reference voltage. In order to restrict the changing of the discharge current versus time, the gate of the power control transistor 29 is given a positive potential, so that this transistor is rendered conductive to reduce part of the gate voltage of power stage transistor 30. Due to the fact that the control voltage from the output CN of the control circuit is applied to the gate of the additional transistor 29, the required input impedance is decisive for the switching process of the power stage transistor 30.

FIG. 3 is a circuit diagram of a power amplifier which is an improved embodiment of the circuit shown in FIG. 2. The transistors 23' to 30' are identical to transistors 24 to 30 as discussed above in regard to FIG. 2. The embodiment according to FIG. 3 has the advantage, compared with that of FIG. 2, is, that after the required level at output O' of the power amplifier has been reached, the current flow is interrupted by either transistor 25' or 29' respectively, as well as the two conductive pre stage transistors 23' and 28'. As a consequence there is no DC power dissipation.

This improvement is achieved by the circuit of FIG. 3 by adding feedback control transistors 36 and 31 in series with the power control transistors 25' or 29' respectively. These added feedback control transistors 31 and 36 are of the same conductivity type as their associated power control transistors, 25' and 29' respectively. Additionally, two sets of feedback control biasing transistors 34 and 35 and 32 and 33 are coupled to the gates of transistors 26' and 30' respectively. The gates of these complementary transistors are connected to each other and to the gate of the associated power stage transistors 26' or 30', respectively. The source of N type transistor 34 is connected to the reference potential and its drain to the gate of P type transistor 36 and to the drain of the P type transistor 35, whose source is connected to the output O'. The source of the P type transistor 32 is connected to the operating voltage VH, its drain to the gate of N type transistor 31 serially arranged with the additional transistor 29'. The source of the N type transistor 33 is also connected to the gate of transistor 31 and its drain is connected to the output O' of the power amplifier.

The operation of the circuit is described with reference to the switching process by means of which the output O' is raised from a low level to a high level. To achieve this, the input DP is driven positive so that the prestage transistor 23' is rendered conductive and pulls down the gates of the transistors 26' and 35.

The transistor 26' is thereby rendered conductive and begins to charge the output capacity $C_0$. Transistor 35 is also rendered conductive and switches the rising potential at the output O' of the power amplifier to the gate of the transistor 36, so that transistor 36 is also conductive. Because additional transistor 25' is also conductive by virtue of signal CP on its gate the rise of potential caused at the output O1' of the prestage by the current of the additional transistor 25' when flowing through the prestage transistor 23' ensures the output impedance of the power amplifier required for the switching process.

As soon as the output O' has reached its high value, transistor 36 is rendered non-conductive and the current flow through the series-arranged transistors 36, 25', and 23' is shut off so that there is no DC power dissipation.

When the power amplifier is switched from high to low level, data input DN goes negative. The prestage transistor 27' is thus rendered conductive and applies a positive potential to the gate of the power stage transistor 30' causing it to be conductive and to bring the output O' down towards the reference voltage, i.e. discharges the capacitor $C_0'$. At the same time, at the gate of the additional transistor 29', a positive potential CN is applied so that this transistor is conductive. The transistor 31 arranged in series therewith is also conductive since its gate is connected to output O' via the conductive transistor 33 whose gate is connected to the power stage transistor 30'. Owing to the two transistors 31 and 29' the potential at the gate of power stage transistor 30' changes slowly in accordance with the output impedance required. After having reached the low value, the potential of output O' is transmitted via the conductive transistor 33 to the gate of the transistor 31 which is thus rendered non-conductive. In this manner, the generation of a DC power dissipation is prevented for the period in which the power amplifier is not activated.

By means of transistors 32 or 34, respectively, the gate of transistor 36 or 31, respectively, rendered non-conductive by the switching process, is discharged at the next switching process to make sure that upon a third switching process the transistor 36 or 29 is again conductive.

The voltage divider resistors R1 and R2 of the control circuit shown in FIG. 1 can be diffused P type strips in an n-well on the semiconductor chip in which are formed the transistors. Resistors R3 and R4 can be provided off chip or if on chip, can also be diffused p-conductive strips in an n-well. With separable fuses these resistors can be trimmed. For temperature compensation a diode can be provided in a series connection.

The power stage transistors can be composed of a plurality of equally dimensioned field effect transistors arranged in parallel. In that case, resistors R3 and R4 have a value which corresponds to an integer multiple of the required output impedance of the composed power stage field effect transistors. The integer multiple is determined by the number of field effect transistors arranged in parallel.

Having now described a preferred embodiment of the present invention using field effect transistors it should now be apparent to one skilled in the art that other changes and modifications can be made thereto without departing from the present invention which is to be limited only to the following claims wherein:

What is claimed:

1. A circuit for maintaining the impedance of a power amplifier during switching between power levels on a capacitively loaded output line comprising:
   a power amplifier circuit having a power stage transistor coupled to a capacitively loaded output line, and
   a control circuit comprising a differential amplifier circuit having a first input coupled to a voltage source, a second input coupled to a feedback means, and an output,
   said output being coupled to the power amplifier, to impedance control means for simulating said power stage transistor and to said feedback means, said power amplifier circuit further including a prestage transistor and a power control transistor coupled to said power stage transistor, said prestage transistor being further coupled to a data input and said power control transistor being further coupled to the output of said control circuit.

2. The circuit of claim 1 wherein said power amplifier circuit further comprises a feedback control transistor in series with the power control transistor and a pair of complementary feedback control biasing transistors coupled to said feedback control transistor, one of said feedback control biasing transistors being connected to the capacitively loaded output line and the other to a voltage.

3. The circuit of claim 1 wherein said output is coupled to the power control transistor of said power amplifier and said feedback means through an inverter.

4. The circuit of claim 1 wherein said feedback means comprises serially arranged transistors for biasing a simulating transistor coupled in series with an impedance resistor and a connection from the junction of the simulating transistor and the impedance resistor to the second input.

5. The circuit of claim 1 wherein said voltage source coupled to said input is a voltage divider coupled between an operating voltage and a reference voltage.

6. A circuit for maintaining the impedance of a power amplifier during switching between power levels on a capacitively loaded output line comprising:

a power amplifier circuit having two sets of complementary prestage transistors coupled to respective data inputs and to the control elements of respective complementary power stage transistors, each power stage transistor being connected between a capacitively loaded output line and to respective voltages, the control element of each power stage transistor being connected to a respective power control transistor, each of said power control transistors being of the same semiconductor type as the power stage transistor to which it is connected and having a control electrode each power control transistor being further connected to a respective voltage source through a respective feedback control transistor having a control element coupled to a complementary pair of feedback control biasing transistors, one of said feedback control biasing transistors being connected to ground and the other of said feedback control biasing transistors being connected to a voltage, and a power control circuit providing control voltages to said power control transistors comprising, a pair of differential circuit, each having an input coupled to a voltage divider and an input coupled to a respective feedback line from respective simulation transistors and to an output coupled to a respective one of said power control transistors, said output of each said differential circuit being coupled through a complementary pair of transistors to a respective one of said power control transistors and to a respective one of said simulation transistors, each of said respective simulation transistors being coupled in series with an impedance resistor between an operating voltage source and a reference voltage source.

* * * * *